US011275312B1

(12) United States Patent
Dunphy et al.

(10) Patent No.: US 11,275,312 B1
(45) Date of Patent: Mar. 15, 2022

(54) SYSTEMS AND METHODS FOR VERIFYING PHOTOMASK CLEANLINESS

(71) Applicant: Waymo LLC, Mountain View, CA (US)

(72) Inventors: James Dunphy, San Jose, CA (US); Hongqin Shi, San Jose, CA (US); David Hutchison, Santa Clara, CA (US); Yeh-Jiun Tung, Sunnyvale, CA (US); Eric Copenhaver, Mountain View, CA (US); Nao Chuei, San Mateo, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

(21) Appl. No.: 17/107,072

(22) Filed: Nov. 30, 2020

(51) Int. Cl.
    *G03F 7/20* (2006.01)
(52) U.S. Cl.
    CPC ...... *G03F 7/70341* (2013.01); *G03F 7/70525* (2013.01)
(58) Field of Classification Search
    CPC .................. G03F 7/70341; G03F 7/70525
    USPC .............................. 355/30, 67, 72
    See application file for complete search history.

(56) References Cited

U.S. PATENT DOCUMENTS

| 7,230,676 | B1 | 6/2007 | Loopstra et al. |
| 7,443,487 | B2 | 10/2008 | Hori |
| 7,633,600 | B2 | 12/2009 | Onvlee et al. |
| 7,771,919 | B2 | 8/2010 | Ionkin |
| 8,228,482 | B2 | 7/2012 | Kanaya |
| 8,427,627 | B2 | 4/2013 | Kivitis et al. |
| 8,508,718 | B2 | 8/2013 | Hazelton et al. |
| 8,625,070 | B2 | 1/2014 | Farnsworth et al. |
| 8,817,227 | B2 | 8/2014 | Stavenga et al. |
| 9,568,841 | B2 | 2/2017 | Sengers et al. |
| 10,345,712 | B2 | 7/2019 | Streefkerk et al. |
| 10,345,713 | B2 | 7/2019 | Raaymakers et al. |
| 10,444,635 | B2 | 10/2019 | Schoormans et al. |

(Continued)

FOREIGN PATENT DOCUMENTS

WO    2009/069845    6/2009

OTHER PUBLICATIONS

Bloomstein et al., "22-nm immersion interference lithography," Optics Express, Jul. 10, 2006, pp. 6435-6443, vol. 14, No. 14.

(Continued)

*Primary Examiner* — Hung Nguyen
(74) *Attorney, Agent, or Firm* — McDonnell Boehnen Hulbert & Berghoff LLP

(57) ABSTRACT

The present application relates to contact immersion lithography systems and methods of their use. An example immersion lithography system includes a photomask substrate and at least one sensor disposed along a surface of the photomask substrate. The immersion lithography system also includes a controller having at least one processor and a memory. The at least one processor is configured to execute program instructions stored in the memory so as to carry out operations. The operations include receiving, from the at least one sensor, information indicative of an electric field proximate to the at least one sensor. The operations also include determining, based on the received information, at least one of: a thickness of a liquid layer adjacent to the photomask substrate or a distance to a further substrate adjacent to the photomask substrate.

18 Claims, 9 Drawing Sheets

(56) References Cited

U.S. PATENT DOCUMENTS

| | | |
|---|---|---|
| 2007/0291261 A1 | 12/2007 | Kobayashi |
| 2008/0284993 A1 | 11/2008 | Shneyder et al. |
| 2009/0061331 A1 | 3/2009 | Nakano |
| 2009/0109413 A1 | 4/2009 | Shibazaki et al. |
| 2009/0135382 A1 | 5/2009 | Kida |
| 2009/0168037 A1 | 7/2009 | Kroonen et al. |
| 2009/0316122 A1 | 12/2009 | Prosyentosov et al. |
| 2010/0271910 A1 | 10/2010 | Boutaghou |
| 2013/0088245 A1 | 4/2013 | Sezginer |
| 2015/0092175 A1* | 4/2015 | Ohishi ................. G03F 9/7053 355/72 |
| 2016/0187788 A1* | 6/2016 | Onose ................. G03F 7/70408 355/67 |
| 2019/0107776 A1 | 4/2019 | Thaler et al. |
| 2020/0103759 A1* | 4/2020 | Yoon ................. G03F 7/70475 |

OTHER PUBLICATIONS

Vasdekis et al., "Simple Microfluidic Integration of 3D Optical Sensors Based on Solvent Immersion Lithography," CLEO: 2014 OSA Technical Digest (online), Optical Society of America, 2014, Jun. 8-13, 2014, 2 pages.

* cited by examiner

SYSTEMS AND METHODS FOR VERIFYING PHOTOMASK CLEANLINESS

BACKGROUND

The manufacture of various optical components such as light guides and other optical devices may be performed with oblique contact immersion lithography. In such scenarios, achieving sharp corners/edges in photoresist is beneficial to achieve high optical transmission efficiency of waveguiding structures. To achieve sharp corners/edges, the substrate/photoresist is typically placed very close to the photomask. However, the substrate is not in direct contact with the mask, in order to avoid having the photoresist stick to the mask. For example, if photoresist sticks to the mask, the process may fail. Furthermore, if dust or other impurities are present on the mask, the process may fail. Accordingly, there is a need for a way to confirm a properly-spaced and clear gap between the substrate/photoresist and the photomask.

SUMMARY

Example embodiments relate to devices, systems, and methods for immersion lithography.

In a first aspect, an immersion lithography system is provided. The immersion lithography system includes a photomask substrate and at least one sensor disposed along a surface of the photomask substrate. The immersion lithography system includes a controller having at least one processor and a memory. The at least one processor is configured to execute program instructions stored in the memory so as to carry out operations. The operations include receiving, from the at least one sensor, information indicative of an electric field proximate to the at least one sensor. The operations also include determining, based on the received information, at least one of: a thickness of a liquid layer adjacent to the photomask substrate or a distance to a further substrate adjacent to the photomask substrate.

In a second aspect, a method is provided. The method includes receiving, from at least one sensor disposed along a photomask substrate, information indicative of an electric field proximate to the at least one sensor. The method also includes determining, based on the received information, at least one of: a thickness of a liquid layer adjacent to the photomask substrate or a distance to a further substrate adjacent to the photomask substrate.

Other aspects, embodiments, and implementations will become apparent to those of ordinary skill in the art by reading the following detailed description, with reference where appropriate to the accompanying drawings.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. Overview

Immersion lithography includes maintaining a very thin gap of fluid material between a photomask substrate and a further substrate with photoresist. An adjustable mechanism may be used to apply a selectable or desirable force between the photomask and the further substrate. However, in some scenarios, application of a predetermined force may not provide an appropriate fluid gap between the two substrates.

Cleanliness of the fluid material is an important factor to achieve high quality lithography. For example, even small particles (~0.1 um) in the fluid material can accumulate at the edges of patterns on photomask. These small particles may degrade the side walls of resist features, making them rough. Such particles may originate from the environment (ambient air), operator, equipment, and/or substrate/photoresist.

Electrical detection, such as through capacitance or resistance measurements, could be used to monitor the water gap and/or the presence of particles before, during, and after photolithographic immersion exposure. The sensors can be designed into the photomask coating, which is conductive, and may include a plurality of interleaved conductive traces. The different resistance and dielectric constant of the sensor relative to water makes the capacitance or resistance of the sensor dependent on the water gap thickness. A large gap may indicate contamination or another type of mechanical issue, such as an undesirable or unexpected photoresist thickness.

II. Example Immersion Lithography Systems

Figure 1:
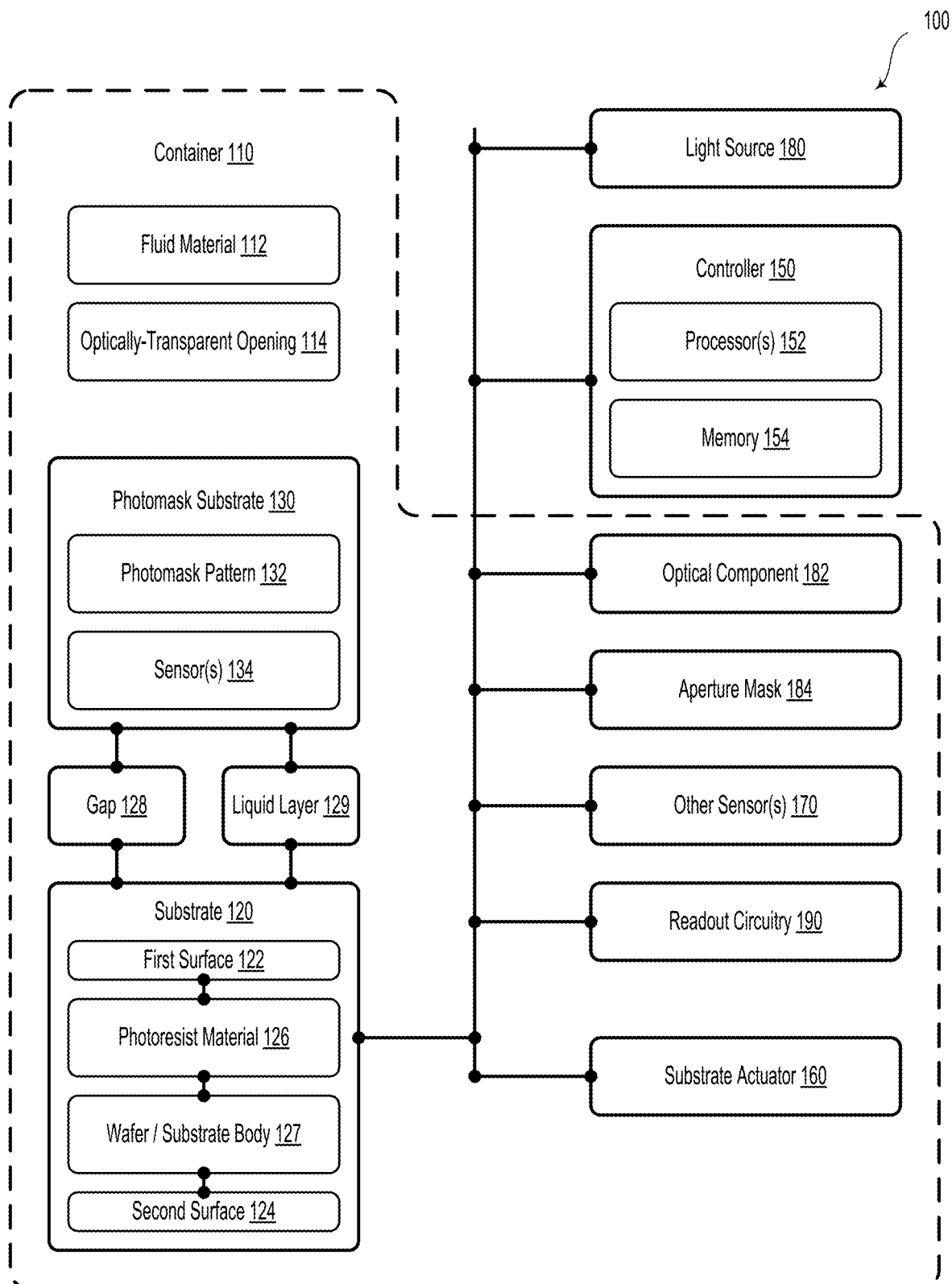
FIG. 1 illustrates an immersion lithography system, according to an example embodiment.

FIG. 1 illustrates an immersion lithography system 100, according to an example embodiment. The immersion lithography system 100 could include a container 110 configured to contain a fluid material 112. In some embodiments, the fluid material 112 could include at least one of: water (e.g., deionized water), glycol, or glycerol. Additionally or alternatively, the fluid material 112 could include a mixture of two or more different materials (e.g., water and glycerol). It will be understood that many other fluid materials could be utilized in the contact immersion lithography processes described herein, and all such variations are contemplated and possible within the scope of the present disclosure.

The immersion lithography system 100 also includes a substrate 120 disposed within the container 110. The substrate 120 could be formed from barium crown glass (e.g., H-Bak7), other types of glass, Ge, ZnSe, plastic, or another type of optically transparent material. Other materials are possible. The substrate has a first surface 122 and a second surface 124. The substrate 120 includes a photoresist material 126, which may form at least the first surface 122 of the substrate 120. In some embodiments, the photoresist material 126 could include one or more layers of a negative tone epoxy photoresist, such as HARE SQ. However, other photoresist materials and/or positive tone resists are contemplated and possible.

For example, the substrate 120 could include a wafer/substrate body 127 that is coated with the photoresist material 126 to form the first surface 122. A backside surface of the wafer/substrate body 127 could form the second surface 124. The wafer/substrate body 127 could include a full wafer substrate (e.g., 6 inch wafer) or a portion of a wafer substrate (e.g., 1 cm×1 cm sample). In such scenarios, the wafer/substrate body 127 could be formed from silicon, gallium arsenide, or another semiconductor material. In other examples, the wafer/substrate body 127 could be another type of solid material, such as glass. It will be understood that the various possible materials of the wafer/substrate body could provide varying electrical properties. Accordingly, the various sensors described herein (e.g., sensor 134) could be selected or designed based on such electrical properties of the wafer/substrate body.

In such scenarios, the substrate 120 may be immersed in the fluid material 112 (e.g., water) so as to enable immersion lithography processes. As such, it is beneficial to keep the fluid material 112 clean and free from particles or dust from the environment or generated by the exposure process.

The immersion lithography system 100 includes a photomask substrate 130 disposed within the container 110. The photomask 130 is optically coupled to the photoresist material 126 by way of a gap 128 comprising the fluid material 112 (e.g., liquid layer 129). In some embodiments, it may be desirable to maintain a uniform, very narrow fluid gap between the wafer (e.g., substrate 120) and photomask 130 to achieve the desired structures (e.g., angled photoresist structures). The term "immersion lithography", as described herein, relates to and/or is particularly relevant to the illumination of photoresist immersed in a liquid at varying (and potentially steep) angles of incidence so as to form angled structures in the developed photoresist.

In some embodiments, photolithography processes may be affected by different gaps 128 between the substrate 120 and photomask 130 during exposure. As an example, if the gap 128 between the substrate 120 and the photomask 130 is greater than approximately 20 or 30 microns, the projected image of the photomask 130 on the photoresist material 126 could be out of focus. In other words, when positioned and exposed while at gap distance that is larger than 10 microns, the developed photoresist could include rounded corners and other non-idealities due to the blurred illumination light. For applications where the photoresist structures are used for optical applications (e.g., waveguiding), rounding or chamfer of the waveguides could reduce the optical transmission efficiency of the device.

In contrast, if the gap 128 between the substrate 120 and the photomask 130 is less than approximately 10 microns during exposure, the developed photoresist structures may be sharper with better-defined edge features. Additionally or alternatively, in the case of embodiments utilizing angled photolithography, controlling the gap distance may be beneficial to controlling the lateral placement of exposed photoresist features. In such scenarios, the lateral position of photoresist features may vary based on the gap distance. Accordingly, accurately controlling the gap distance can provide the lateral position of photoresist features within a desired tolerance or range. In such examples, the photoresist features may align with, and/or be properly disposed with respect to, other mechanical features of an optical system (e.g., a lidar system).

The immersion lithography system 100 also includes at least one sensor 134 disposed along a surface of the photomask substrate 130. Sensor 134 is described in more detail with reference to FIGS. 2A and 2B. In alternative embodiments, sensor 134 could be disposed along the substrate 120 or another reference surface. It will be understood that the sensor 134 could be disposed along or couple to other surfaces so as to provide information indicative of the gap 128 and/or thickness of the liquid layer 129.

In some embodiments, the immersion lithography system 100 may additionally include a light source 180 configured to produce illumination light. In such scenarios, the light source 180 is optically coupled to the container 110. The light source 180 could be, for example, a collimated ultraviolet (UV) lamp. It will be understood that other types of light sources suitable for photolithography methods are possible and contemplated.

The immersion lithography system 100 additionally includes a controller 150 having at least one processor 152 and a memory 154. The at least one processor 152 is configured to execute program instructions stored in the memory 154 so as to carry out operations. In some embodiments, the controller could include an application-specific integrated circuit (ASIC).

The operations could include controlling the substrate actuator 160 to adjust a position of the substrate 120 with respect to the photomask substrate 130. For example, the substrate actuator 160 could be configured to adjust the relative position of the substrate 120 and the photomask substrate 130 so as to adjust the gap 128 between the photomask 130 and the photoresist material 126.

The operations include receiving, from the at least one sensor 134, information indicative of an electric field proximate to the at least one sensor 134. In some embodiments, receiving the information indicative of an electric field proximate to the at least one sensor 134 could include receiving information indicative of at least one of a resistance or a capacitance.

The operations also include determining, based on the received information, at least one of: a thickness of a liquid layer 129 adjacent to the photomask substrate 130 or a distance (e.g., gap 128) to a further substrate 120 adjacent to the photomask substrate 130.

In some examples, the operations also include determining that at least one of: the thickness of the liquid layer (e.g., liquid layer 129) adjacent to the photomask substrate 130 or the distance (e.g., gap 128) to the further substrate 120 adjacent to the photomask substrate 130 is within a desired distance range. In such scenarios, the desired distance range could be between zero and 30 microns. It will be understood that other desired distance ranges are possible and contemplated. For example, in various embodiments, the desired distance could be between 10 microns and 20 microns, between 20 microns and 50 microns, or between 50 microns and 100 microns.

In some embodiments, the immersion lithography system 100 could additionally include a light source 180. In such scenarios, the operations also include, in response to determining the desired distance range, causing the light source 180 to illuminate photoresist (e.g., photoresist material 126) disposed on the further substrate 120 by way of the photomask substrate 130 (e.g., illuminating through the photomask substrate 130).

In some embodiments, the photomask substrate 130 includes a photomask pattern 132. At least a portion of the at least one sensor 134 includes a portion of the photomask pattern 132.

In some embodiments, the gap 128 between the photomask 130 and the photoresist material 126 may be monitored and/or adjusted based on information received from one or more other sensors 170. The other sensors 170 could include a laser interferometer, a camera, a depth gauge, or another type of distance-measurement sensor. In such a way, the other sensors 170 could be configured to provide, to the controller 150, information indicative of an actual distance (e.g., the gap 128) between the photomask 130 and the photoresist material 126.

It can be challenging to achieve the proper narrow gap between the substrate 120 and the photomask 130 because direct contact between the substrate 120 and the photomask 130 may lead to sticking, scratching, and/or breakage. Additionally, it can be difficult to utilize thin spacers or shims to physically maintain the desired gap. For example, the spacers or shims should be in a region without photoresist so as to prevent photoresist from sticking to the spacer or shim. Furthermore, it can be difficult to handle ~10 micron thick shim material. Yet further, photoresist thickness variations from wafer to wafer can be large. Accordingly, utilizing shims to control the distance between the surface of the photoresist and the photomask 130 can be unpredictable and/or provide poor reproducibility.

Accordingly, the described immersion lithography system 100 additionally includes an adjustable mechanism that is controllable to apply a selectable or desirable force to the substrate. For example, the mechanism may be configured to apply a desired force to the second surface 124 of the substrate 120. An inflatable balloon can provide a simple but finely controllable and uniform pressure on the substrate. Alternative or additional mechanisms may include a foam or array of springs. Accordingly, embodiments described herein may be configured to controllably adjust the gap 128 between the photomask 130 and the first surface 122 of the substrate 120.

In some embodiments, the immersion lithography system 100 could include readout circuitry 190. The readout circuitry 190 could include a voltage or current source configured to drive the sensor 134 with a sine wave and/or a square wave having a frequency (e.g., a resonant frequency) of around 3 MHz. For example, the readout circuitry 190 could include a differential voltage or current source that is electrically connected to the sensor 134. In some scenarios, the readout circuit 190 could be connected to the sensor 134 by way of one or more capacitors. In such examples, no net DC voltage may be applied to the sensor 134, which may beneficially avoid electrochemical corrosion. Other electrical circuits, waveforms, frequencies, and/or frequency ranges are possible and contemplated.

Figure 2A:
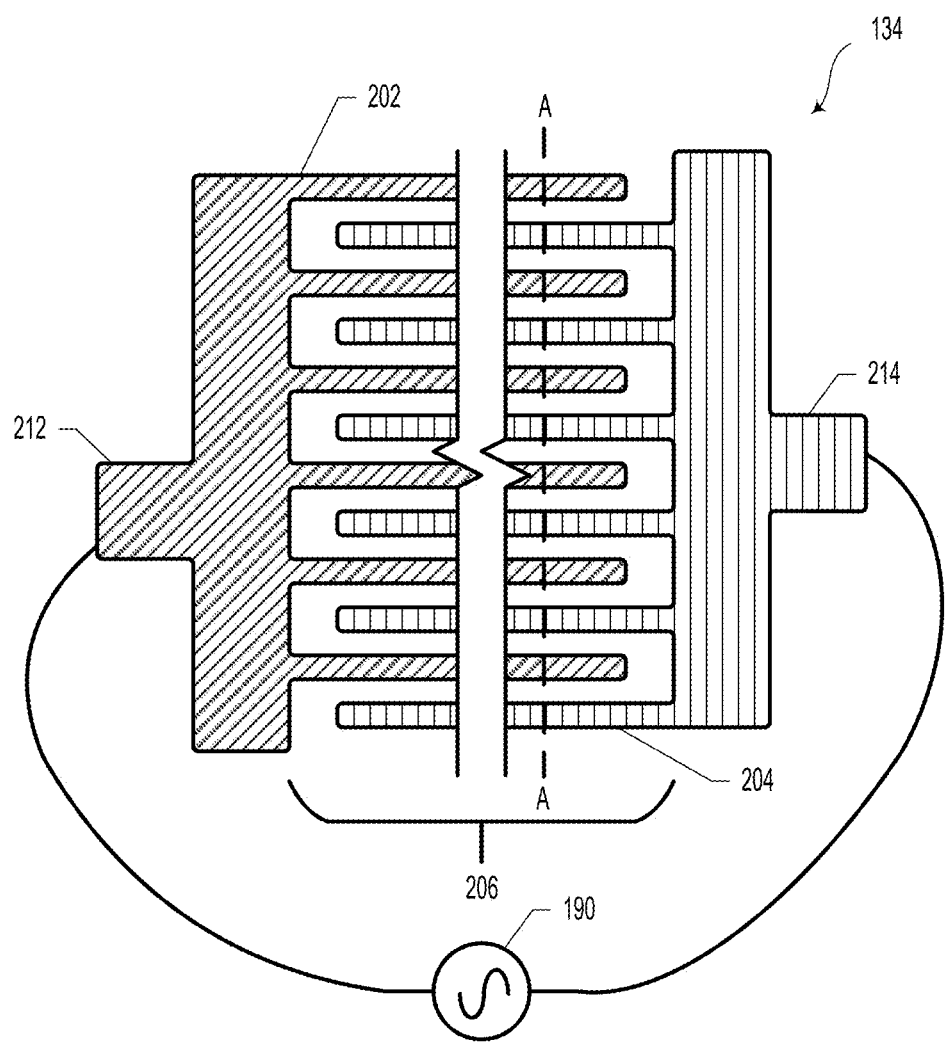
FIG. 2A illustrates a sensor of the immersion lithography system of FIG. 1, according to an example embodiment.
Figure 2B:
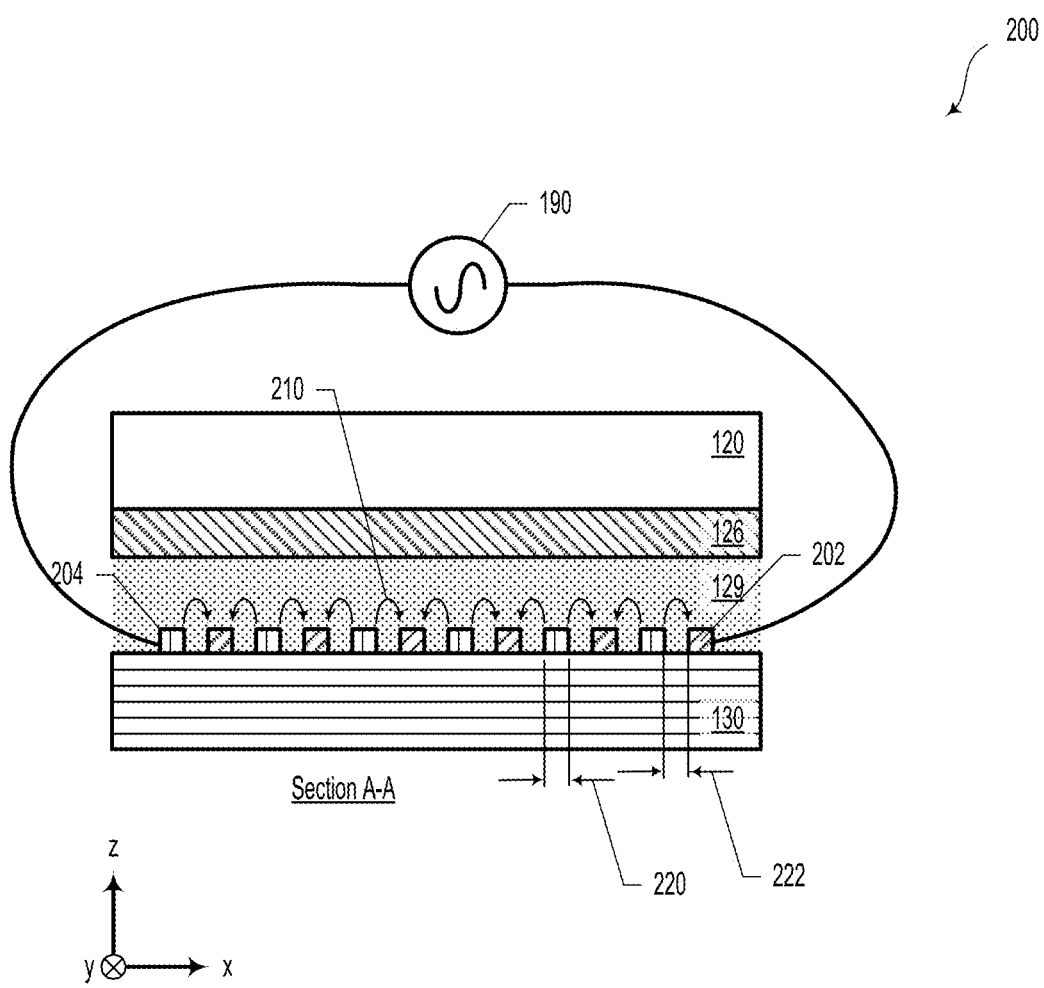
FIG. 2B illustrates the sensor of the immersion lithography system of FIG. 1, according to an example embodiment.

FIGS. 2A and 2B illustrate a sensor 134 of the immersion lithography system 100 of FIG. 1, according to an example embodiment. In some embodiments, the sensor 134 could include a first set of elongate structures 202 and a second set of elongate structures 204. The elongate structures could include high aspect ratio finger-like or line-like structures. In such scenarios, the first set of elongate structures 202 and the second set of elongate structures 204 could be disposed in an interdigitated arrangement 206. As an example, the elongate structures 202 and/or 204 could be formed from chromium. As an example, the elongate structures 202 and/or 204 could include a chromium thin film. Additionally or alternatively, the elongate structures 202 and/or 204 could include an anti-reflective coating comprising chromium oxide. In some embodiments, chromium may be beneficial due to its good wear resistance and hardness. However, the elongate structures 202 and/or 204 could be formed from one or more other conductive materials (e.g., copper, gold, aluminum, etc.).

In various examples, the elongate structures 202 and/or 204 could be sized so as to measure a liquid layer 129 thickness and/or gap 128 of between 5 microns to 100 microns. Other gap distances (e.g., less than 5 microns or more than 100 microns) are possible as well.

In various embodiments, the interdigitated arrangement 206 could include a linewidth 220 of between 20 microns to 80 microns and a spacewidth 222 of 20 microns to 80 microns. It will be understood that linewidth 220 and spacewidth 222 could be different distances that could be selected based on a distance of the gap 128 to be measured and/or based on the material of the substrate 120. In some examples, the interdigitated arrangement 206 includes a variable period grating structure. That is, in some embodiments, the interdigitated arrangement 206 could include elongate structures that have varying linewidths 220 and/or spacewidths 222. For example, the variable period grating structure could include a linear gradient of different linewidths 220 and/or spacewidths 222. Other types of variable period arrangements are possible and contemplated.

In some embodiments, the interdigitated arrangement 206 could include between 20 and 150 elongate structures (e.g., 10 to 75 elongate structures per set). Alternatively, the interdigitated arrangement 206 could include more or fewer elongate structures.

In various embodiments, a plurality of pogo pin connectors could be configured to land on one or more contact pads 212 and 214. In some embodiments, the contact pads are electrically coupled to the controller 150 by way of the plurality of pogo pin connectors.

Figure 2C:
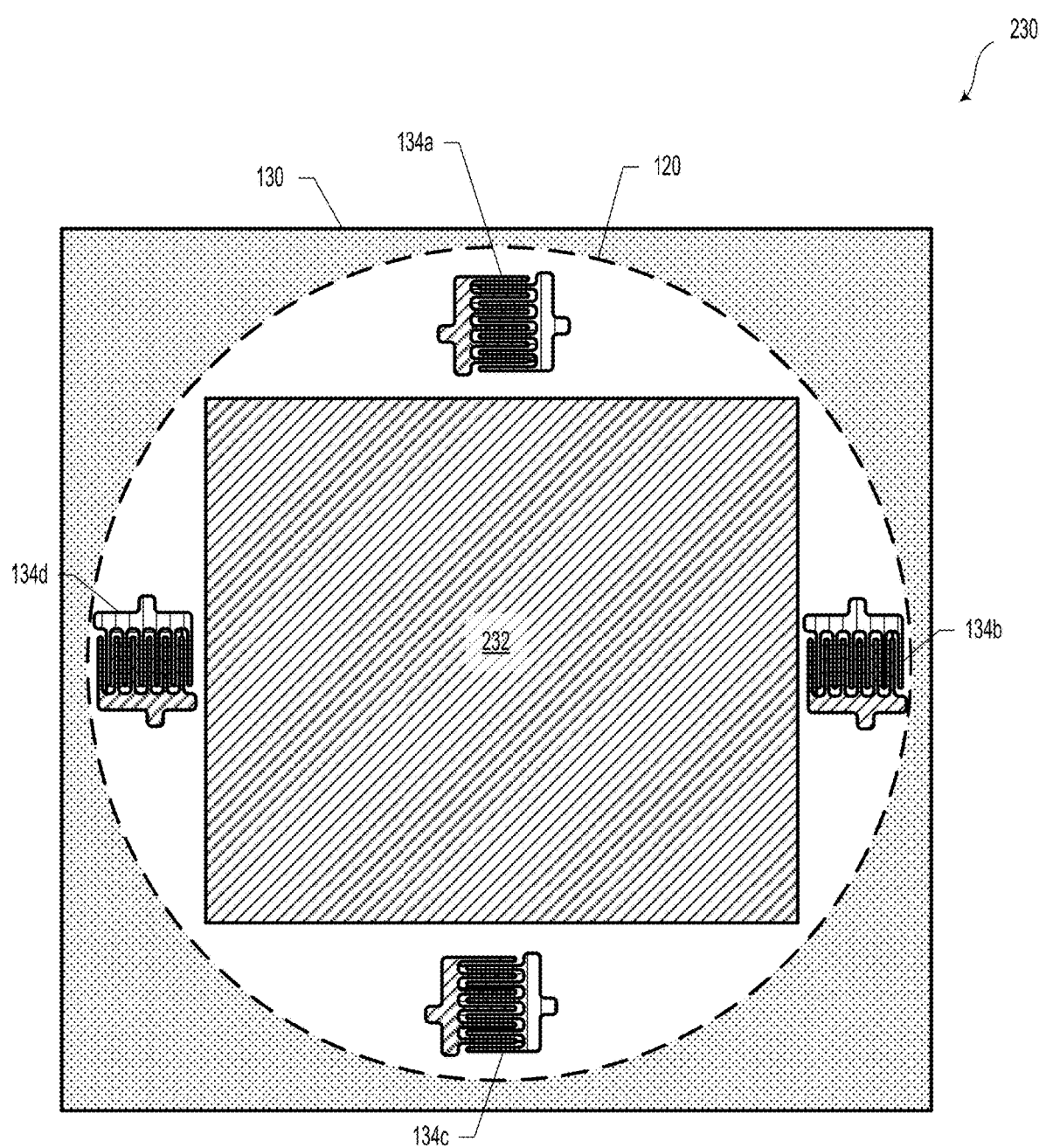
FIG. 2C illustrates sensor layout, according to an example embodiment.

FIG. 2C illustrates sensor layout 230, according to an example embodiment. Sensor layout 230 could include a plurality of sensors 134a, 134b, 134c, and 134d, which could be arranged along the photomask substrate 130. Additionally, in various embodiments, the photomask substrate 130 could include an exclusion region 232. In such scenarios, the sensors could be disposed along the photomask substrate 130 outside of the exclusion region 232. In some embodiments, the exclusion region 232 could correspond to a device region where certain devices could be fabricated on the substrate 120. The device region could include, for example, various optical elements (e.g., optical waveguides, lenses, etc.) and/or optoelectronic devices (e.g., light-emitter devices). By arranging the plurality of sensors 134a, 134b, 134c, and 134d outside of the exclusion region 232, the sensors will not interfere with photolithography and other optoelectronic manufacturing steps that could be conducted inside the exclusion region 232.

In some embodiments, the immersion lithography system 100 could include a substrate actuator 160. The substrate actuator 160 could be mechanically coupled to the substrate 120 and could be configured to provide a nearly uniform force (near constant force over each area element) across the second surface 124 of the substrate 120. As such, the substrate actuator 160 may help provide a uniform gap between photoresist material 126 and photomask 130. In some examples, the substrate actuator 160 could include one or more mass flow controllers (MFCs) or other types of adjustable flow valves.

While embodiments herein describe the substrate actuator 160 as providing a force on the substrate 120 to adjust the gap 128, it will be understood that other controllable-force elements configured to provide a force on the second surface 124 of the substrate 120 are possible and contemplated. For example, such controllable-force elements could include a foam, a piezoelectric material, a hydraulic element, or an array of springs.

In example embodiments, the container 110 could include an optically-transparent opening 114. In such scenarios, the illumination light illuminates the photoresist material 126 by way of the optically-transparent opening 114. While FIG. 1 illustrates some elements of system 100 as being inside the container 110, it will be understood that in other embodiments, such elements could be outside the container 110, and vice versa.

In various embodiments, the immersion lithography system 100 may also include an optical component 182 configured to direct the illumination light from the light source 180 to illuminate the photoresist material 126 at a desired angle and to expose at least an angled structure in the photoresist material 126. In such scenarios, the optical component 182 may include at least one mirror arranged to reflect at least a portion of the illumination light to illuminate the photoresist material 126 at the desired angle.

In some embodiments, the desired angle could be substantially 45 degrees with respect to a surface of the substrate. It will be understood that other desired angles (e.g., angles between 15-80 degrees with respect to the first surface 122 of the substrate 120) are possible and contemplated.

In various embodiments, the immersion lithography system 100 could include an aperture mask 184 disposed between the light source 180 and the substrate 120. The aperture mask 184 could include one or more openings. Each opening in the aperture mask 184 could correspond to respective desired structures in the photoresist material 126. In some example embodiments, the respective desired structures could include at least one of: an angled structure or a vertical structure.

Additionally or alternatively, the immersion lithography system 100 could include a wafer cassette loading and wafer alignment unit.

Figure 3A:
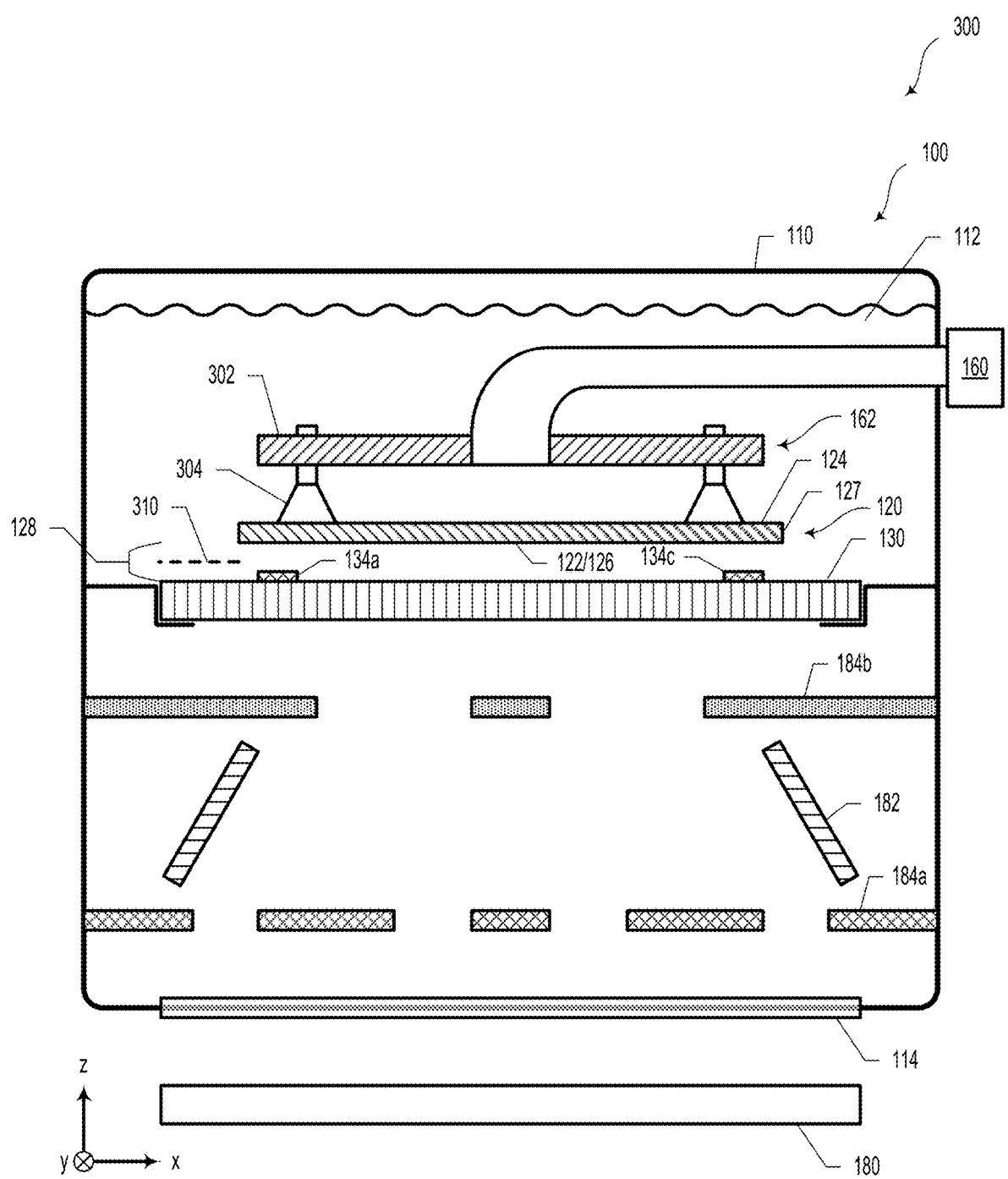
FIG. 3A illustrates a scenario including the immersion lithography system of FIG. 1, according to an example embodiment.

FIG. 3A illustrates a scenario 300 that includes the immersion lithography system 100 of FIG. 1, according to an example embodiment. Scenario 300 includes an actuator assembly 162, which may include a substrate 120 that is coupled to one or more vacuum suction cups 304 (e.g., four suction cups) that are attached to an apparatus with a substrate actuator 160.

The actuator assembly 162 may be attached to a container 110, which may additionally provide structural support for the substrate actuator 160 and/or a way to load/unload the substrate 120 into/out of the fluid material 112.

A first surface 122 of the substrate 120 may include a photoresist material 126 coated on the wafer/substrate body 127. A distance between the first surface 122 and the photomask 130 is shown as gap 128. In some embodiments, a desired gap 310 could provide a desired lithography condition. As an example, arranging the substrate 120 with the desired gap 310 with respect to the photomask 130 could provide the benefit of forming sharp, angled structures in the photoresist material 126. In some embodiments, the desired gap 310 could be between 5-10 microns, between 10-15 microns, or between 0-50 microns. It will be understood that other desired gaps are possible and contemplated.

Figure 3B:
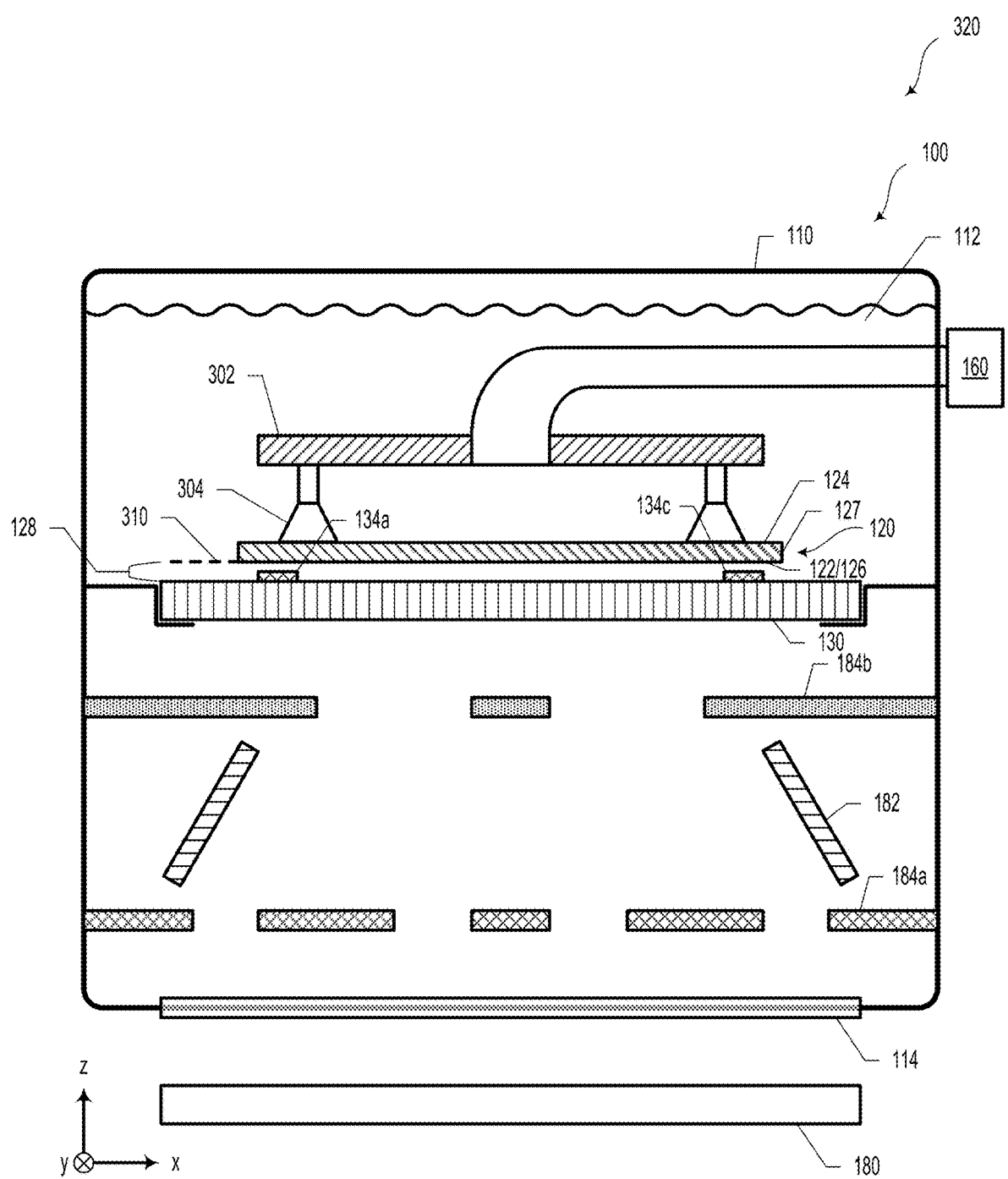
FIG. 3B illustrates a scenario including the immersion lithography system of FIG. 1, according to an example embodiment.

FIG. 3B illustrates a scenario 320 including the immersion lithography system 100 of FIG. 1, according to an example embodiment. As illustrated in FIG. 3B, the substrate actuator 160 could be controlled so as to adjust and/or maintain the force and pressing speed of the substrate 120 with respect to the photomask 130.

In an example embodiment, a force of 5 N could be used. However, a variety of different pressing forces (e.g., 1-20 N) are possible and contemplated. In some embodiments, the force could be calibrated by way of weights or other types of calibration measures.

By controlling the pressing force and time, the gap can be controlled, as predicted by the Stefan adhesion equation. The Stefan adhesion equation predicts the film thickness, ho, as a function of pressing time T and pressing force F.

$$FT = \frac{3}{2}\mu\pi a^4 \int_0^T \frac{h_t}{h^3} dt = \frac{3}{2}\mu\pi a^4 \int_{h_0}^\infty \frac{dh}{h^3} = \frac{3\mu\pi a^4}{4h_0^2}.$$

As an example, for a water-filled gap and a 10 N applied force, the Stefan adhesion equation predicts that it will take about 10 seconds to achieve a 10 micron gap. Additionally or alternatively, with a 5 N pressing force, a 30 second pressing duration may result in a 10 micron gap. As an alternative, lower forces, such as 2 N could be utilized. However, lower pressing forces may require longer pressing times to achieve the same gap. As yet another example, with a fixed pressing force of 10 N, a pressing duration of 100 seconds could provide an approximately 5 micron gap.

While not illustrated herein, it will be understood that the pressing force could be measured by way of a load cell or another force-measurement method.

Figure 3C:
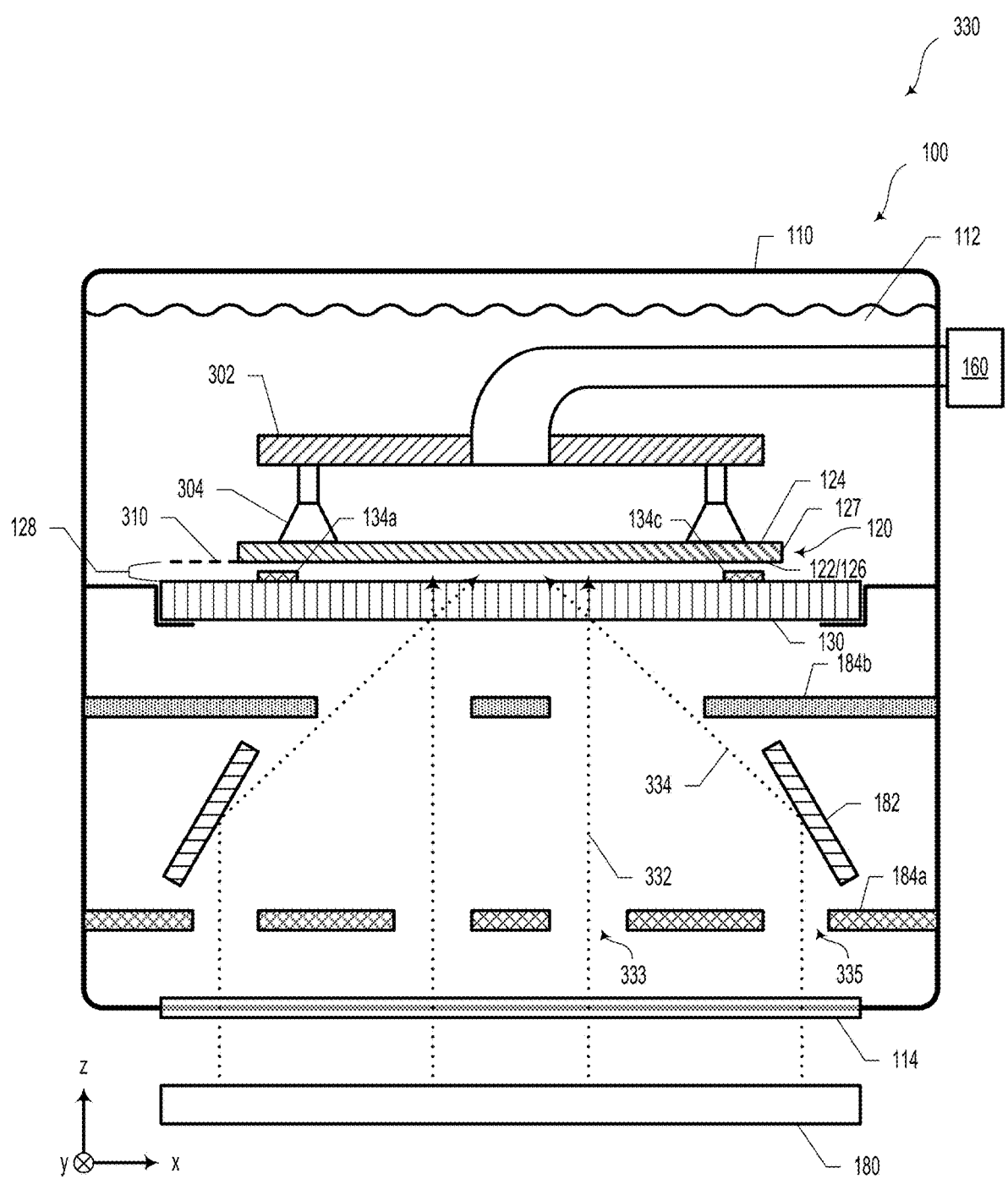
FIG. 3C illustrates a scenario including the immersion lithography system of FIG. 1, according to an example embodiment.

FIG. 3C illustrates a scenario 330 including the immersion lithography system 100 of FIG. 1, according to an example embodiment. As illustrated in scenario 330, once the gap 128 has been adjusted to be substantially equal to the desired gap 310 (e.g., utilizing the sensor 134, the gap 128 may be substantially maintained due to lack of a pushing or pulling force.

Once the substrate 120 has been properly positioned with respect to the photomask 130, the light source 180 may be controlled so as to illuminate the photomask 130 and the substrate 120 with illumination light.

In some embodiments, a first portion 334 of the illumination light could be directed towards the optical component 182 by passing through a first opening 335 that corresponds to the angled structure.

Additionally or alternatively, a second portion 332 of the illumination light could be directed towards the substrate 120 by passing through a second opening 333 that corresponds to a desired vertical structure in the photoresist material 126. In such scenarios, the second portion of the illumination light illuminates the photoresist material 126 at a substantially normal angle to expose the desired vertical structure in the photoresist material 126. While FIGS. 3A-3C illustrate a system for angled immersion photolithography, it will be understood that the immersion lithography system could be configured to utilize direct illumination (e.g., perpendicular illumination) from the light source 180.

III. Example Methods

Figure 4:
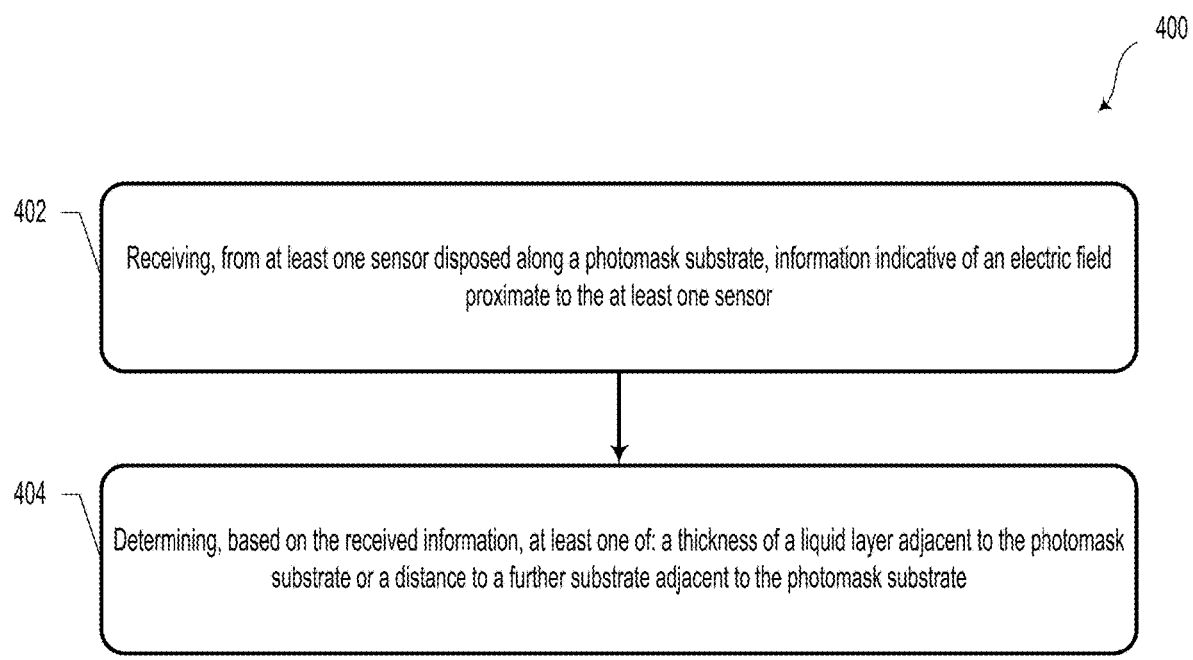
FIG. 4 illustrates a method, according to an example embodiment.

FIG. 4 illustrates a method 400, according to an example embodiment. While method 400 illustrates one block of a method of manufacture, it will be understood that more blocks or steps could be included. In such scenarios, at least some of the various blocks or steps may be carried out in a different order than of that presented herein. Furthermore, blocks or steps may be added, subtracted, transposed, and/or repeated. Some or all of the blocks or steps of method 400 may be carried out by immersion lithography system 100 and/or sensor 200, as illustrated and described in reference to FIGS. 1, 2A, and 2B.

Block 402 includes receiving, from at least one sensor (e.g., sensor 134) disposed along a photomask substrate (e.g., photomask substrate 130), information indicative of an electric field (e.g., electric field 210) proximate to the at least one sensor.

Block 404 includes determining, based on the received information, at least one of: a thickness of a liquid layer (e.g., liquid layer 129) adjacent to the photomask substrate or a distance (e.g., gap 128) to a further substrate (e.g., substrate 120) adjacent to the photomask substrate.

In some embodiments, the at least one sensor includes a first set of elongate structures (e.g., elongate structure 202) and a second set of elongate structures (e.g., elongate structures 204). The first set of elongate structures and the second set of elongate structures are disposed in an interdigitated arrangement.

In various embodiments, receiving the information indicative of an electric field proximate to the at least one sensor could include receiving information indicative of at least one of a resistance or a capacitance. As an example, the information indicative of the electric field could include a readout voltage or current. In such scenarios, the electric field could be determined based on the readout voltage or current, electrical properties of the sensor and substrate, and/or geometric features proximate to the sensor.

In some examples, method 400 could additionally include determining that at least one of: the thickness of the liquid layer adjacent to the photomask substrate or the distance to the further substrate adjacent to the photomask substrate is within a desired distance range. For example, the desired distance range could be between zero and 20 microns. In other embodiments, the desired distance range could be between zero and 30 microns, between zero and 50 microns, between zero and 100 microns, among other possibilities.

In such scenarios, in response to determining the desired distance range, method 400 could include causing a light source (e.g., light source 180) to illuminate photoresist (e.g., photoresist material 126) disposed on the further substrate by way of the photomask substrate.

Figure 5:
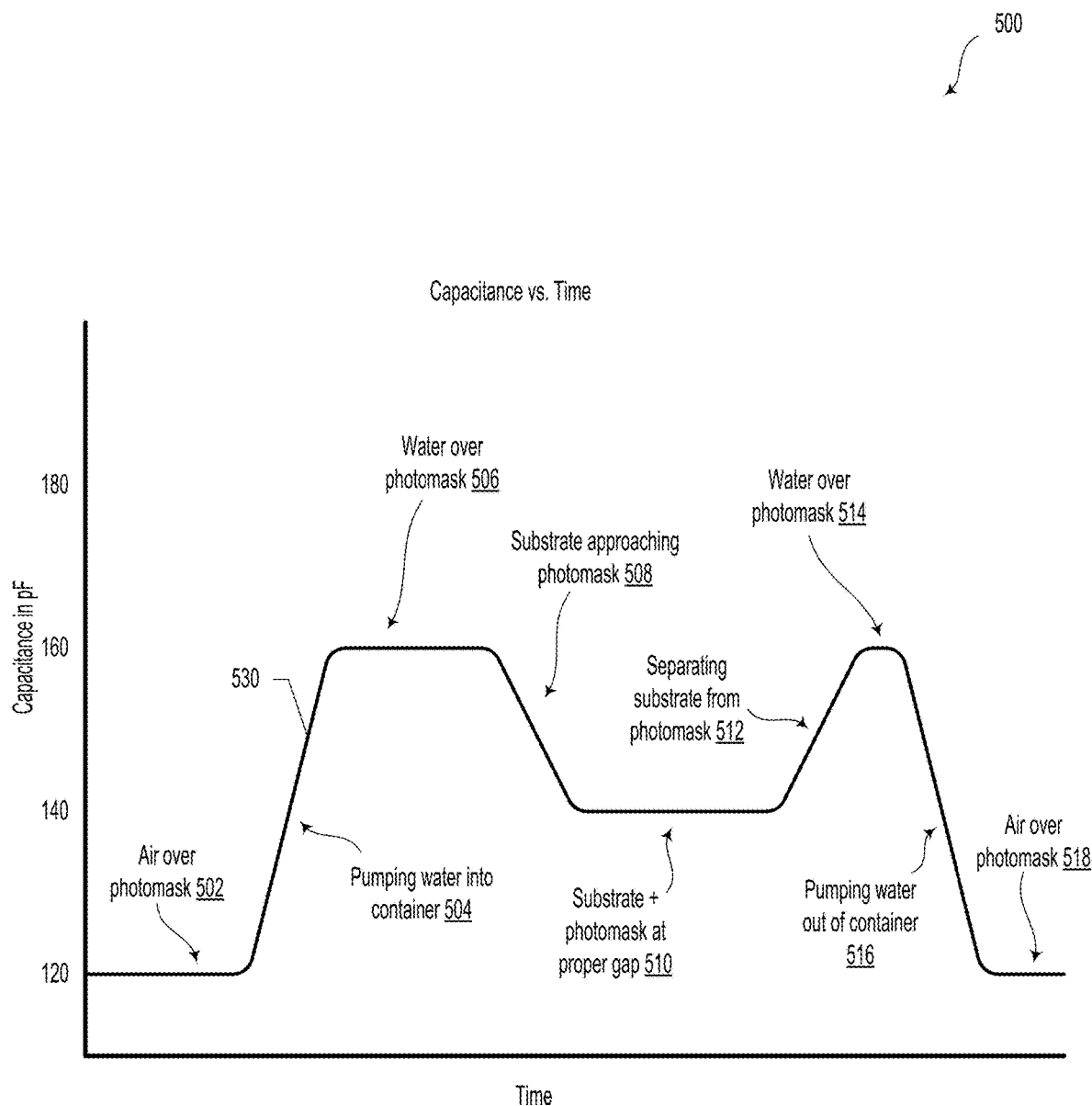
FIG. 5 illustrates an operating scenario of the immersion lithography system of FIG. 1, according to an example embodiment.

FIG. 5 illustrates an operating scenario 500 of the immersion lithography system 100 of FIG. 1, according to an example embodiment. It will be understood that operating scenario 500 may include various blocks or steps that could be performed in a different order than that of FIG. 5.

Operating scenario 500 could be include a measured capacitance waveform 530, which could be based on a capacitance over time of an interdigitated capacitance sensor (e.g., sensor 134) that could be arranged along a surface of a photomask substrate (e.g., photomask substrate 130). Although FIG. 5 illustrates measured capacitances between 120 pF to 160 pF, it will be understood that in other examples, capacitance waveform 530 may span other ranges of capacitance. For example, capacitance waveform 530 could range from 50 pF to 100 pF, 100 pF to 200 pF, and/or 200 pF to 400 pF.

In some embodiments, data 502 could represent the capacitance (e.g., 120 pF) of the sensor when exposed to air.

Data 504 could include a capacitance of the sensor while pumping water into a container (e.g., container 110). In such a scenario, the capacitance could increase from 120 pF to 160 pF while water fills the container so as to cover the sensor.

Data 506 could include the capacitance level (e.g., approximately 160 pF) of the sensor while water completely covers the sensor and photomask substrate.

Data 508 includes the capacitance level of the sensor as a substrate (e.g., substrate 120) is moved within proximity with the photomask substrate. In such a scenario, the capacitance of the sensor could go from 160 pF to 140 pF while the substrate approaches the photomask.

Data 510 could include the capacitance (e.g., 140 pF) of the sensor while the substrate and the photomask are maintained at a desired gap distance (e.g., 10 microns or less). During this period of time, the photomask and underlying photo-sensitive material (e.g., photoresist material 126) could be exposed with ultraviolet (UV) or extreme ultraviolet (EUV) light.

Data 512 could include the capacitance of the sensor while the substrate is being separated from the photomask. In such a scenario, the capacitance could increase from 140 pF to 160 pF.

Data 514 could include the capacitance level (e.g., approximately 160 pF) of the sensor while water again completely covers the sensor and photomask substrate.

Data 516 could include the capacitance level of the sensor while water is removed from the container and data 518 could include the capacitance level of the sensor without water covering the photomask. In some embodiments, the distance of the gap and/or thickness of the fluid layer could be determined by near-linear relationship of approximately 1 pF/micron. However, other relationships between capacitance and gap/thickness are possible and contemplated.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. An immersion lithography system comprising:
    a photomask substrate;
    at least one sensor disposed along a surface of the photomask substrate, wherein the at least one sensor comprises a first set of elongate structures and a second set of elongate structures, wherein the first set of elongate structures and the second set of elongate structures are disposed in an interdigitated arrangement; and
    a controller comprising at least one processor and a memory, wherein the at least one processor is configured to execute program instructions stored in the memory so as to carry out operations, the operations comprising:
        receiving, from the at least one sensor, information indicative of an electric field proximate to the at least one sensor; and
        determining, based on the received information, at least one of: a thickness of a liquid layer adjacent to the photomask substrate or a distance to a further substrate adjacent to the photomask substrate.

2. The immersion lithography system of claim 1, wherein the elongate structures comprise chromium.

3. The immersion lithography system of claim 1, wherein the elongate structures are sized so as to measure a liquid layer thickness of between 5 microns to 100 microns.

4. The immersion lithography system of claim 1, wherein the interdigitated arrangement comprises a linewidth of between 20 microns to 80 microns and a spacewidth of 20 microns to 80 microns.

5. The immersion lithography system of claim 1, wherein the interdigitated arrangement comprises a variable period grating structure.

6. The immersion lithography system of claim 1, wherein the interdigitated arrangement comprises between 20 to 150 elongate structures.

7. The immersion lithography system of claim 1, wherein the photomask substrate comprises a photomask pattern, wherein at least a portion of the at least one sensor comprises a portion of the photomask pattern.

8. The immersion lithography system of claim 1, wherein the photomask substrate comprises an exclusion region wherein the at least one sensor is disposed along the photomask substrate outside of the exclusion region.

9. The immersion lithography system of claim 1, further comprising a plurality of pogo pin connectors, wherein the at least one sensor comprises a plurality of contact pads, wherein the contact pads are electrically coupled to the controller by way of the plurality of pogo pin connectors.

10. The immersion lithography system of claim 1, wherein receiving the information indicative of an electric field proximate to the at least one sensor comprises receiving information indicative of at least one of a resistance or a capacitance.

11. The immersion lithography system of claim 1, wherein the operations further comprise determining that at least one of: the thickness of the liquid layer adjacent to the photomask substrate or the distance to the further substrate adjacent to the photomask substrate is within a desired distance range.

12. The immersion lithography system of claim 11, wherein the desired distance range is between zero and 20 microns.

13. The immersion lithography system of claim 11, further comprising a light source, wherein the operations further comprise:
    in response to determining the desired distance range, causing the light source to illuminate photoresist disposed on the further substrate by way of the photomask substrate.

14. The immersion lithography system of claim 1, wherein the controller comprises an application-specific integrated circuit (ASIC).

15. A method comprising:
    receiving, from at least one sensor disposed along a photomask substrate, information indicative of an electric field proximate to the at least one sensor, wherein the at least one sensor comprises a first set of elongate structures and a second set of elongate structures, wherein the first set of elongate structures and the second set of elongate structures are disposed in an interdigitated arrangement; and
    determining, based on the received information, at least one of: a thickness of a liquid layer adjacent to the photomask substrate or a distance to a further substrate adjacent to the photomask substrate.

16. The method of claim 15 wherein receiving the information indicative of an electric field proximate to the at least one sensor comprises receiving information indicative of at least one of a resistance or a capacitance.

17. The method of claim 15 further comprising:
    determining that at least one of: the thickness of the liquid layer adjacent to the photomask substrate or the distance to the further substrate adjacent to the photomask substrate is within a desired distance range, wherein the desired distance range is between zero and 30 microns.

18. The method of claim 17, further comprising:
    in response to determining the desired distance range, causing a light source to illuminate photoresist disposed on the further substrate by way of the photomask substrate.

* * * * *